United States Patent [19]

Okubo et al.

[11] Patent Number: 4,797,574
[45] Date of Patent: Jan. 10, 1989

[54] SYNCHRONIZING CIRCUIT

[75] Inventors: Yasuo Okubo, Tokyo; Masataka Hirasawa, Yokohama, both of Japan

[73] Assignee: Kabushiki Kaisha Toshiba, Kawasaki, Japan

[21] Appl. No.: 133,622

[22] Filed: Dec. 16, 1987

[30] Foreign Application Priority Data

Dec. 24, 1986 [JP] Japan .................. 61-306309

[51] Int. Cl.⁴ .................. H03K 5/13; H03K 9/06; H03K 7/00; G05F 5/00
[52] U.S. Cl. .................. 307/269; 307/511; 307/480; 307/527; 307/236; 328/72; 328/63; 328/155; 328/133; 328/134; 328/139
[58] Field of Search .................. 307/269, 511, 480, 527, 307/528, 236, 601, 606; 328/133, 134, 155, 139, 72, 63

[56] References Cited

U.S. PATENT DOCUMENTS

| | | | |
|---|---|---|---|
| 3,755,747 | 8/1973 | Letosky | 328/133 |
| 3,942,124 | 3/1976 | Tarczy-Hornoch | 328/63 |
| 4,277,754 | 7/1981 | Minakuchi | 328/133 |
| 4,317,053 | 2/1982 | Shaw et al. | 307/480 |
| 4,400,664 | 8/1983 | Moore | 328/133 |

Primary Examiner—Stanley D. Miller
Assistant Examiner—Trong Quang Phan
Attorney, Agent, or Firm—Finnegan, Henderson, Farabow, Garrett & Dunner

[57] ABSTRACT

A pulse signal transfer control circuit is located between an input pulse detecting circuit for detecting the arrival of an externally applied input pulse and outputting a pulse signal with a predetermined pulse width, and an R-S flip-flop. The transfer control circuit prohibits the pulse signal from being transferred to the R-S flip-flop during a period in which the R-S flip-flop is set, a period of generation of a first internal clock signal, and a period of generation of a second internal clock signal, and allows the pulse signal to be transferred to the first R-S flip-flop during period in which the first and second clock signals are not generated and the period in which the first R-S flip-flop is reset.

9 Claims, 2 Drawing Sheets

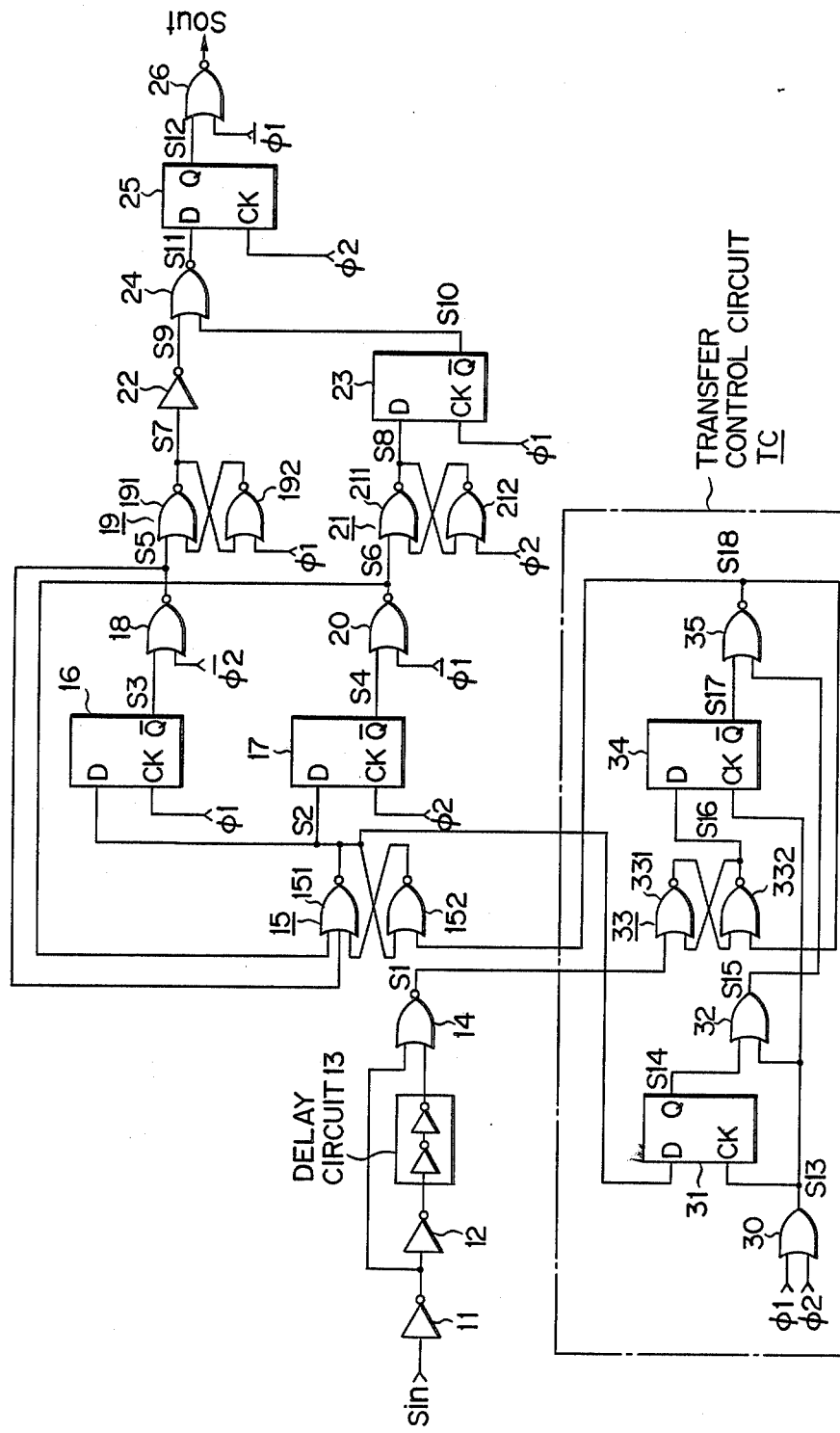
F I G. 1

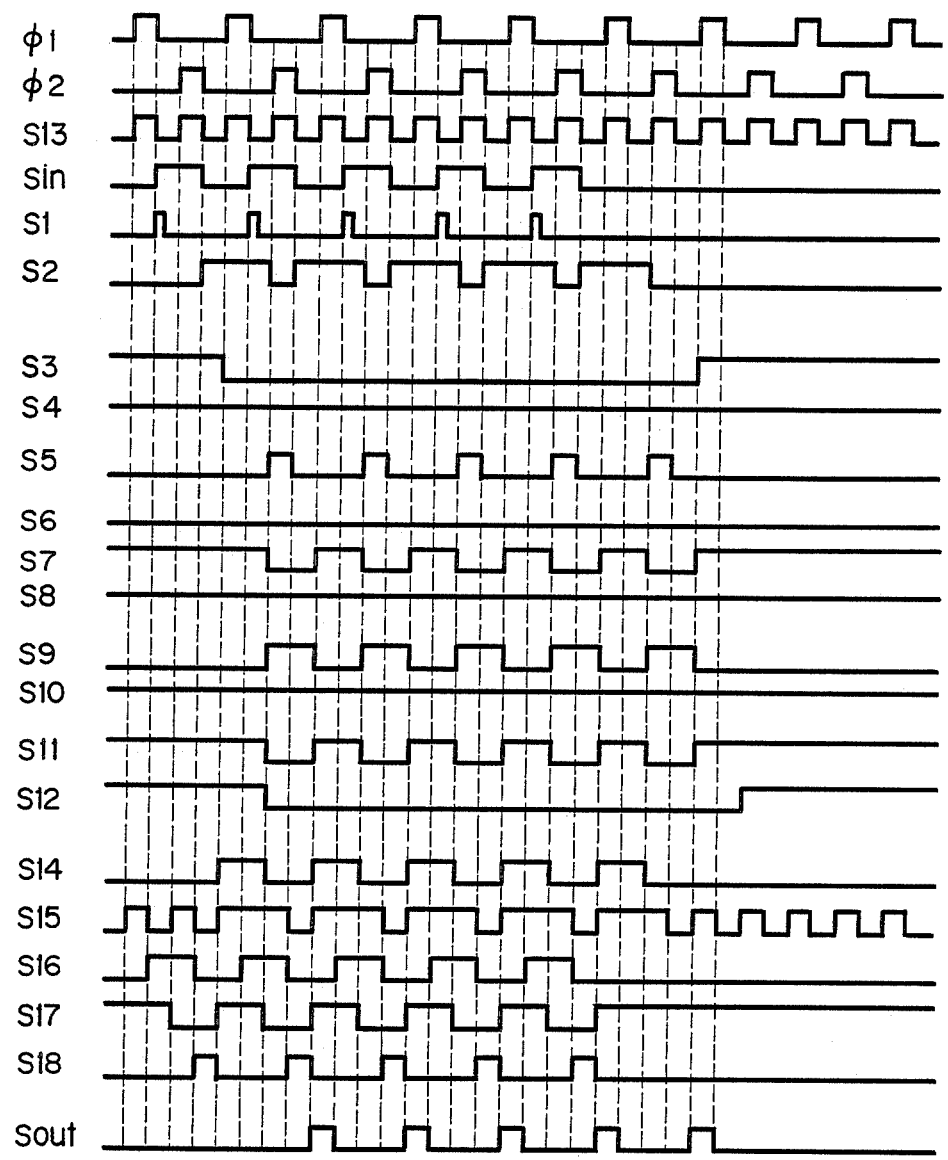
F I G. 2

SYNCHRONIZING CIRCUIT

BACKGROUND OF THE INVENTION

This invention relates to a synchronizing circuit for synchronizing an input pulse, which is asynchronously input from outside, with an internal clock signal.

A synchronizing circuit is generally used as an input circuit in a device (such as pulse transmission circuits, digital control circuits, and computers) in which signal processing progresses under the control of a clock pulse signal.

A typical example of this type of known synchronizing circuit is a device which employs R-S flip-flop. In this circuit, the R-S flip-flop (FF) is set by arrival of input pulses from exterior, and the logical "1" signal output from the set FF is supplied to a first input terminal of an AND gate. The second input of the AND gate is coupled to receive the clock pulse signal. When the "1" signal is supplied to the AND gate, the AND gate permits the clock pulse signal to be generated as an output signal of the synchronizing circuit. At this time, the R-S FF is reset by the output signal, and is returned to its original state.

In the synchronizing circuit thus arranged, the R-S FF is set by the randomly arrival input pulse, and is reset by the clock pulse generated at a predetermined timing. Jitter, for example, frequently gives rise to a problematic situation wherein the input pulse overlaps with or appears closer in time to the clock pulse. In this situation, the FF operation becomes instable. This may cause the synchronizing circuit to operate erroneously. For example, when the input pulse arrives during a period in which the clock pulse is raised, the set signal is pulled into—and cancelled by—the reset signal.

In the case where the set signal, i.e., the input pulse signal falls after the reset signal, i.e., the clock pulse signal falls, the R-S FF is set at the time the reset signal becomes "0", thus ensuring that the synchronizing circuit operates properly. When the pulse width of the input pulse is wide, the R-S FF is more stable. To prevent the cancellation of the set signal, the conventional synchronizing circuit is provided with an input pulse detecting circuit for changing the pulse width of the input pulse signal into a relatively long pulse width. The output signal from this detector, in place of the external input pulse, is input to the R-S FF.

When a pulse hoving an excessively wide pulse width is generated from the detector, the R-S FF is undesirably set a plural number of times due to the pulse, thereby providing unnecessary pulses. This occurs in the following case. The reset signal is generated during a period that set signal is input to the R-S FF, and the set signal inputting progresses after the reset signal has fallen. In other words, after the R-S FF is reset by the reset signal, it is set again by the set signal.

It is for this reason that the pulse width of the pulse signal from the detector must be set to the maximum value of those values preventing the generation of a plurality of output pulses by a single set signal.

The detector generally contains a delay circuit. The pulse width of the pulse from the detector can be adjusted by appropriately selecting the delay time of the delay circuit. The usual delay circuit is composed of a CR time constant circuit consisting of resistive and capacitive elements, for example, or cascade connected inverters consisting of transistors, for example. Those elements inevitably suffer from variations of their constants arising from the manufacturing stage or due to ambient temperature variation. Therefore, it is very difficult to obtain an exact delay time by the delay circuit. Therefore, in designing the delay circuit, the variation of the delay time must be considered. This makes it difficult to cause the detector to output the pulses with an desired and exact pulse width. This variation problem may be solved by using a compensating circuit for compensating for the delay time variation. This approach, however, requires a large pattern area of the semiconductor chip. This is problematic when it is assembled into the LSI chip.

SUMMARY OF THE INVENTION

Accordingly, an object of the invention is to provide a synchronizing circuit which can output the input pulse thereto, while exactly synchronized with the clock pulse even if the input pulse overlaps with or appears close in time to the clock pulse due to jitter, for example.

According to this invention, there is provided a synchronizing circuit for synchronizing an asynchronous pulse signal externally applied, with an internal clock signal, comprising, input pulse detecting means for detecting the arrival of the externally applied input pulse signal and generating a pulse signal of a predetermined width, a first bistable circuit, first latch means for latching the output signal from the first bistable circuit in synchronism with a first internal clock signal, second latch means for latching the output signal of the first bistable circuit in synchronism with a second internal clock signal, which is different in phase from the first internal clock signal, reset signal generating means which responds to the output signal from one of the first and second latch means which executed the latching operation, and supplies a reset signal to the first bistable circuit during a period of generation of the clock signal corresponding to the latch means which did not execute the latching operation, output means for outputting the output signal from the reset signal generating means in synchronism with one of the first and second clock signals, and pulse signal transfer control means, which receives the pulse signal output from the detecting means, prohibits the pulse signal from being transferred to the first bistable circuit during a period in which the first bistable circuit is set, a period of generation of the first clock signal, and a period of generation of the second clock signal, and allows the pulse signal to be transferred to the first bistable circuit during a period in which the first and second clock signals are not generated and the period in which the first bistable circuit is reset.

The synchronizing circuit thus arranged can effectively prevent the signal to set the first bistable circuit from overlapping with the signal to reset that bistable circuit. Further, the pulse width of the signal to set the first bistable circuit is determined by a phase difference between the first and second internal clock signals. This feature eliminates the adverse effect on the pulse width by the temperature variation, ensuring the stable operation.

BRIEF DESCRIPTION OF THE DRAWINGS

FIG. 1 shows a circuit diagram of a synchronizing circuit according to a preferred embodiment of this invention; and FIG. 2 shows a timing chart useful in explaining the operation of the synchronizing circuit of FIG. 1.

DETAILED DESCRIPTION OF THE PREFERRED EMBODIMENT

A preferred embodiment of a synchronizing circuit according to this invention will be described referring to FIGS. 1 and 2.

Input pulse signal Sin which comes from external in an asynchronous manner, is input to a first input terminal of NOR gate 14 via inverters 11 and 12 and delay circuit 13. The other input terminal of this gate 14 is coupled for reception with the output signal from inverter 11. The combination of inverters 11 and 12, delay circuit 13 and NOR gate 24 detects the leading edge of the input pulse signal. NOR gate 14 produces a signal S1 with a pulse width, which corresponds to the delay time by delay circuit 13.

The output signal S1 of NOR gate 14 is supplied as a set signal to NOR gate 152 in flip-flop 15, which is composed of NOR gate 151 and NOR gate 152, via a transfer control circuit TC.

Transfer control circuit TC is composed of OR gate 30, D type flip-flop 31, OR gate 32, R-S flip-flop 33 and D type flip-flop (FF) 34, and NOR gate 35.

In the transfer circuit TC, the output signal S13 of OR gate 30, which is supplied with internal clocks $\phi 1$ and $\phi 2$ with different phases, is supplied to the clock input terminals CK of D-FFs 31 and 34, and further to one of the input terminals of OR gate 32. The data input terminal D of D-FF 31 is supplied with the output signal S2 from NOR gate 151. The output terminal Q of D-FF 31 supplies the signal S14 to the second input terminals of OR gate 32. The output signal from OR gate 32 is supplied to the first input terminal of NOR gate 35.

The clock signal $\phi 1$ has preferably a ¼ period of generation of "1" level, and a ¾ period of generation of "0" level (nongeneration period of signal). Similarly, the clock signal $\phi 2$ has preferably a ¼ period of generation of "1" level, and a ¾ period of generation of "0" level (nongeneration period of signal), and has the same frequency as that of the signal 1. Those clock signals $\phi 1$ and $\phi 2$ have a phase difference of ½ period. See FIG. 2.

The signal S1 from NOR gate 14 is applied as a set signal to the first input terminal of NOR gate 331 in R-S FF 33 made up of NOR gates 331 and 332. NOR gate 332 outputs signal S16.

This signal S16 is supplied to the data input terminal D of D-FF 34. The inverted output terminal $\overline{Q}$ provides signal S17 to the second input terminal of NOR gate 35. The signal S18 output from NOR gate 35 is supplied as a reset signal to the NOR gate 332 of R-S FF 33, and a set signal to NOR gate 142 of R-S FF 15.

When the output signal of NOR gate 151 is set to "1" level by that set signal, its output signal S2 is supplied to the data input terminal D of each of D-FFs 16 and 17.

The clock signal $\phi 1$ is supplied to the clock input terminal CK of D-FF 16, and the clock signal $\phi 2$ is supplied to the clock input terminal CK of D-FF 17. Accordingly, when the leading edge of output signal S2 is within the trailing edges of clock signal $\phi 1$ to that of clock signal $\phi 2$, D-type FF 17 is set, and its inverted output terminal $\overline{Q}$ provides the signal S4 in "0" level. At this time, the output signal S3 from the inverted output $\overline{Q}$ of D-FF 16 remains "1" in level.

The output signal S3 is input to the second input terminal of NOR gate 18 whose first input terminal is coupled for reception with the inverted clock signal $\overline{\phi 2}$. The output signal S5 from NOR gate 18 is supplied to the input terminal of NOR gate 151, as a reset signal for R-S FF 15. The same is also applied as a reset signal to R-S FF 19 made up of NOR gates 191 and 192.

The output signal S4 is applied to the second input terminal of NOR gate 20 which is coupled to the first input terminal with the inverted clock signal $\overline{\phi 1}$. The output signal S6 from NOR gate 20 is supplied to the input terminal of NOR gate 151, as a reset signal for R-S FF 15, and applied as a reset signal to the R-S-FF 21 made up of NOR gates 211 and 212.

With the above connection of the circuit, when the signal S2 rises during a period from the trailing edge of clock signal $\phi 1$ to that of clock $\phi 2$, the output signal S6 of NOR gate 20, which goes high ("1") at the timings of clock signal $\phi 1$, resets the R-S FF 15.

The output signal S7 from NOR gate 191 of R-S FF 19 is transferred to inverter 22 where it is inverted, and supplied to the first input terminal of NOR gate 24. The output signal S8 from NOR gate 211 of R-S FF 21 is supplied to the data input terminal D of D-FF 23, whose clock input terminal CK is coupled with clock signal $\phi 1$. The output signal S10 from the inverted output terminal $\overline{Q}$ of this D-FF 23 is supplied to the second input terminal of NOR gate 24.

The output signal S11 from NOR gate 24 is supplied to the data input terminal D of D-FF 25, which is connected at the clock input terminal with clock signal $\phi 2$. The output signal S12 from the output terminal S12 of D-FF 25 is supplied to the second input terminal of NOR gate 26, which is coupled at the first input terminal with the inverted clock signal $\overline{\phi 1}$, and it is output as output pulse Sout, which is synchronized with clock signal $\phi 1$.

The operation of the synchronizing circuit will be described referring to the timing chart of FIG. 2.

When R-S FF is in a set state, that is, the signal S2 is in "0" level, the signal S14 at the output terminal Q of D-FF 31 is always in "0" level, so that the signal S15 applied to the first input terminal of NOR gate 35, from OR gate 32 is the same as the signal S13 of OR gate 30. That is to say, the signal S15 is the logical sum of clock signals $\phi 1$ and $\phi 2$.

Under this condition, if input pulse signal Sin is input to the synchronizing circuit, inverters 11 and 12, delay circuit 13, and NOR gate 14 cooperate to detect the leading edge of the input pulse signal Sin. And the NOR gate 14 outputs a signal S1 with a pulse width corresponding to the delay time of delay circuit 13. This signal S1 sets the R-S FF 33. As a result, the signal S16 which has been "1" in level, is transferred to the data input terminal D of D-FF 34. The output signal S17 from D-FF 34 is latched at "0" level at the leading edge of clock $\phi 1$ or $\phi 2$ (leading edge of clock $\phi 2$ in FIG. 2). When the clock signals $\phi 1$ and $\phi 2$ are both "0" in level, the output signal of NOR gate 35, i.e., the signal S18, goes high ("1"), to set R-S FF 15. At the same time, the R-S FF is reset, and ready for the reception of the detect data of the next input pulse signal Sin. The timing of supplying the reset signal to R-S FF 15 is in the leading edge of clock $\phi 1$ or $\phi 2$, as already mentioned. This implies that the detect data of input pulse Sin is transferred to R-S FF 15 at the trailing edge of the reset signal.

When R-S FF is set, that is, the output signal S2 of NOR gate 151 is in "1" state, the signal S14 from the output terminal Q of D-FF 31 is latched at the "1" level at the leading edge of clock $\phi1$ or $\phi2$. The output signal S15 sent to the first input terminal of NOR gate 35 from OR gate 32 goes "1" in level and the output signal S18 from NOR gate 35 goes "0".

This operation indicates that when R-S FF 15 is set, the transfer of the detect data of the input pulse Sin is prohibited until R-S FF is set.

In this way, the transfer control circuit TC decides if the data of detecting the leading edge of input pulse Sin is transferred to R-S FF 15 according to a logical state of the R-S FF 15. Therefore, it is possible to prevent the overlapping of the set and reset signals to R-S FF 15, and hence the erroneous operation of the synchronizing circuit.

It is noted that the pulse width of the set signal to R-S FF 15 is determined by the phase difference between clocks $\phi1$ and $\phi2$, not the delay time of the delay circuit. Therefore, the pulse width of the set signal is free from the adverse influence by temperature.

Additionally, the delay circuit shown in FIG. 1 is merely triggered by the R-S FF 33, so that the necessary delay time can be obtained by inverters, for example, not capacitors requiring a large chip area. The chip areas for forming this delay circuit 13 can be saved. Further, if the delay time of delay circuit 13 varies due to variation of ambient temperature, this time delay variation does not bring about any problem.

What is claimed is:

1. A synchronizing circuit comprising:
    input pulse detecting means for detecting the arrival of an externally applied input pulse signal and generating a pulse signal of a predetermined width;
    a first bistable circuit;
    first latch means for latching the output signal from said first bistable circuit, in synchronism with a first internal clock signal;
    second latch means for latching the output signal of said first bistable circuit, in synchronism with a second internal clock signal, which is different in phase from said first internal clock signal;
    reset signal generating means which responds to the output signal from one of said first and second latch means which executed the latching operation, and supplies a reset signal to said first bistable circuit during a period of generation of the clock signal corresponding to the latch means which did not execute the latching operation;
    output means for outputting the output signal from said reset signal generating means, in synchronism with one of said first and second clock signals; and
    pulse signal transfer control means, which receives the pulse signal output from said detecting means, prohibits said pulse signal from being transferred to said first bistable circuit during a period in which said first bistable circuit is set, a period of generation of said first clock signal, and a period of generation of said second clock signal, and allows the pulse signal to be transferred to said first bistable circuit during a period in which said first and second clock signals are not generated and said period in which said first bistable circuit is reset.

2. A synchronizing circuit according to claim 1, in which said pulse signal transfer control means includes a second bistable circuit which is set by the pulse signal output from said detecting means, third latch means for latching the output signal of said second bistable circuit, in synchronism with said first or second clock signal, a fourth latch means for latching the output signal of said first bistable circuit, in synchronism with said first or second clock signal, and gate means, wherein said gate means prohibits the output signal of said third latch means from being transferred as a set signal to said first bistable circuit during a period in which said fourth latch means latches the output signal representing the set state of said first bistable circuit, a period of generation of said first clock signal, and allows the output signal from said third latch means to be transferred as a set signal to said first bistable circuit during period in which said first and second clock signals are not generated and said period in which said fourth latch means latches the output signal representing a reset state of said first bistable circuit.

3. A synchronizing circuit according to claim 1, in which said first bistable circuit is an R-S flip-flop.

4. A synchronizing circuit according to claim 1, in which said first latch means is a D type flip-flop having a data input terminal which is coupled to receive the output signal from said first bistable circuit, and a clock input terminal which is coupled to receive said first clock signal.

5. A synchronizing circuit according to claim 1, in which said second latch means is a D type flip-flop having a data input terminal which is coupled to receive the output signal from said first bistable circuit, and a clock input terminal which is coupled to receive said second clock signal.

6. A synchronizing circuit according to claim 2, in which said second bistable circuit is an R-S flip-flop.

7. A synchronizing circuit according to claim 2, in which said third latch means is a D type flip-flop having a data input terminal which is coupled to receive the output signal from said second bistable circuit, and a clock input terminal which is coupled to receive the logical sum of said first and second clock signals.

8. A synchronizing circuit according to claim 2, in which said fourth latch means is a D type flip-flop having a data input terminal which is coupled to receive the output signal from said first bistable circuit, and a clock input terminal which is coupled to receive the logical sum of said first and second clock signals.

9. A synchronizing circuit according to claim 1, in which said input pulse detecting circuit includes a delay circuit containing at least two inverters.

* * * * *